United States Patent
Yashiki et al.

(10) Patent No.: US 10,366,665 B2
(45) Date of Patent: Jul. 30, 2019

(54) DISPLAY DEVICE AND METHOD FOR EXPANDING COLOR SPACE

(71) Applicant: SHARP KABUSHIKI KAISHA, Sakai, Osaka (JP)

(72) Inventors: Masafumi Yashiki, Sakai (JP); Ryohei Koizumi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/762,490

(22) PCT Filed: Sep. 16, 2016

(86) PCT No.: PCT/JP2016/077365
§ 371 (c)(1),
(2) Date: Mar. 22, 2018

(87) PCT Pub. No.: WO2017/051768
PCT Pub. Date: Mar. 30, 2017

(65) Prior Publication Data
US 2018/0286327 A1 Oct. 4, 2018

(30) Foreign Application Priority Data
Sep. 24, 2015 (JP) .................................. 2015-186363

(51) Int. Cl.
*G09G 5/00* (2006.01)
*G09G 3/36* (2006.01)
(Continued)

(52) U.S. Cl.
CPC ....... *G09G 3/3607* (2013.01); *G02F 1/13306* (2013.01); *G02F 1/133514* (2013.01);
(Continued)

(58) Field of Classification Search
CPC .......... G09G 3/3607; G09G 5/36; G09G 5/02; G09G 5/00; G09G 2310/0235;
(Continued)

(56) References Cited

U.S. PATENT DOCUMENTS

2009/0315921 A1* 12/2009 Sakaigawa ........... G09G 3/2003 345/694
2014/0168284 A1* 6/2014 Kabe .................... G09G 3/3648 345/690
(Continued)

FOREIGN PATENT DOCUMENTS

JP 2010-033009 A 2/2010

*Primary Examiner* — Amit Chatly
(74) *Attorney, Agent, or Firm* — ScienBiziP, P.C.

(57) ABSTRACT

A signal processing circuit comprising: a signal separation unit separating an input video signal into components of individual colors; an expanded video signal generation unit performing an expansion process for increasing a signal value of the input video signal, and outputting data obtained by the expansion process as an expanded video signal; an expansion coefficient decision unit deciding an expansion coefficient to be used for the expansion process; and an output video signal generation unit generating an output video signal for output to the display panel based on the expanded video signal. The expansion coefficient decision unit decides the inverse of the saturation as the expansion coefficient for a pixel, at which the saturation is not smaller than a predetermined value, and decides the expansion coefficient based on a quadratic function.

11 Claims, 13 Drawing Sheets

(51) Int. Cl.
  *G09G 5/02* (2006.01)
  *G09G 5/36* (2006.01)
  *G02F 1/133* (2006.01)
  *G02F 1/1335* (2006.01)
  *H01L 27/12* (2006.01)
  *H04N 9/64* (2006.01)
  *H04N 9/68* (2006.01)

(52) U.S. Cl.
  CPC ......... *G02F 1/133603* (2013.01); *G09G 5/00* (2013.01); *G09G 5/02* (2013.01); *G09G 5/36* (2013.01); *H01L 27/1214* (2013.01); *G09G 2310/0235* (2013.01); *G09G 2340/06* (2013.01); *H04N 9/64* (2013.01); *H04N 9/68* (2013.01)

(58) Field of Classification Search
  CPC ............ G09G 2340/06; G02F 1/13306; G02F 1/133514; G02F 1/133603; H01L 27/1214; H04N 9/64; H04N 9/77; H04N 9/68
  See application file for complete search history.

(56) References Cited

U.S. PATENT DOCUMENTS

| | | | |
|---|---|---|---|
| 2014/0292840 A1* | 10/2014 | Harada | G09G 3/3426 345/694 |
| 2017/0061873 A1* | 3/2017 | Nakanishi | G09G 3/3225 |
| 2017/0076654 A1* | 3/2017 | Wang | G09G 3/2074 |

* cited by examiner

DISPLAY DEVICE AND METHOD FOR EXPANDING COLOR SPACE

TECHNICAL FIELD

The present invention relates to a display device, and more specifically relates to a display device that expands a color space by displaying white in addition to the three primary colors.

BACKGROUND ART

Generally, in a liquid crystal display device for producing a color display, one pixel is divided into three sub pixels: a red sub pixel provided with a color filter that transmits red light, a green sub pixel provided with a color filter that transmits green light, and a blue sub pixel provided with a color filter that transmits blue light. The color display can be produced by the color filters provided in these three sub pixels. However, in recent years, for the purpose of expanding a color space (a color gamut or a color reproduction range), there has also been developed a liquid crystal display device in which one pixel includes a white sub pixel that transmits white light, and the above three sub pixels (i.e., a liquid crystal display device in which one pixel includes the white sub pixel, the red sub pixel, the green sub pixel, and the blue sub pixel).

Further, since the liquid crystal display device employing a color filter system as described above has the problem of having low light use efficiency, a liquid crystal display device employing a field-sequential color system in which a color display is produced without using color filters has also become widespread. In a typical liquid crystal display device adopting the field-sequential color system, one frame period being a display period for one screen is temporally divided into three fields. While the field is also referred to as a subframe, in the following description, the term "field" is used uniformly.

In the liquid crystal display device employing the field-sequential color system, typically, one frame period is temporally divided into a field (red field) for displaying a red screen based on a red component of an input video signal, a field (green field) for displaying a green screen based on a green component of an input video signal, and a field (blue field) for displaying a blue screen based on a blue component of an input video signal. By displaying the primary colors one by one as above, a color image is displayed on a liquid crystal panel. Displaying a color image in such a manner eliminates the need for color filters in the liquid crystal display device employing the field-sequential color system. Accordingly, the liquid crystal display device employing the field-sequential color system has high light use efficiency as compared with that of the liquid crystal display device employing the color filter system. Hence, the liquid crystal display device employing the field-sequential color system is suitable for increasing luminance and reducing power consumption.

In the liquid crystal display device employing the field-sequential color system described above, a field (white field) for displaying a white screen is provided in addition to the above three fields in order mainly to reduce color breakup.

As described above, in the liquid crystal display device employing the color filter system, the white sub pixel is provided so as to expand the color space, while in the liquid crystal display device employing the field-sequential color system, the white field is provided so as mainly to reduce color breakup. Meanwhile, a signal value for white is decided based on a signal value for red, a signal value for green, and a signal value for blue. At that time, an expansion process for increasing signal values for red, green and blue is performed so as to expand the color space. Generally, the expansion process is performed by multiplying an original signal value for each of red, green, and blue by a constant coefficient (hereinafter referred to as an "expansion coefficient").

Japanese Patent Application Laid-Open No. 2010-33009, for example, discloses an invention of an image display device in which one pixel is configured by four sub pixels (a red sub pixel, a green sub pixel, a blue sub pixel, and a white sub pixel) to expand a color space. In the image display device disclosed in Japanese Patent Application Laid-Open No. 2010-33009, "the maximum value of lightness (the maximum lightness)" with saturation taken as a variable is previously stored into a signal processing unit, and an expansion coefficient is decided based on saturation obtained from an input video signal and the maximum lightness stored in the signal processing unit. The expansion coefficient is then used to perform the expansion process on the input video signal. In such a manner, the color space (HSV color space) is expanded from one as shown in FIG. 20 to one as shown in FIG. 21.

PRIOR ART DOCUMENT

Patent Document

[Patent Document 1] Japanese Patent Application Laid-Open No. 2010-33009

SUMMARY OF THE INVENTION

Problems to be Solved by the Invention

However, according to the image display device disclosed in Japanese Patent Application Laid-Open No. 2010-33009, the maximum lightness needs to be previously stored into the signal processing unit. That is, a memory or the like for storing the maximum lightness is required. This has caused increases in IC size and cost. In addition, in the case where the expansion coefficient is decided by another method, there is concern that display problems may occur.

Accordingly, an object of the present invention is to achieve a display device capable of expanding a color space without causing an increase in IC size, an increase in cost, and display problems.

Means for Solving the Problem

A first aspect of the present invention is directed to a display device provided with a display panel for displaying an image, the display device including:

an expanded video signal generation unit configured to perform an expansion process for increasing a signal value of an input video signal, and output data obtained by the expansion process as an expanded video signal;

an expansion coefficient decision unit configured to decide an expansion coefficient to be used for the expansion process by the expanded video signal generation unit; and an output video signal generation unit configured to generate an output video signal to be outputted to the display panel based on the expanded video signal, wherein the expansion coefficient decision unit decides the expansion coefficient based on a first function, which is a function representing an inverse of saturation obtained based on the input video signal, for a pixel with the saturation not smaller than a predetermined value, and decides the expansion coefficient based on a second function that is a quadratic function, in which saturation obtained based on the input video signal is set to a parameter and a coefficient of a quadratic term is a negative value, for a pixel with the saturation not larger than the predetermined value, and the expanded video signal generation unit multiplies the expansion coefficient, decided by the expansion coefficient decision unit, by a signal value of the input video signal for each pixel, to generate the expanded video signal.

According to a second aspect of the present invention, in the first aspect of the present invention, a value in the predetermined value of the first function is the same as a value in the predetermined value of the second function, and a slope of a curve representing the first function at the predetermined value is the same as a slope of a curve representing the second function at the predetermined value.

According to a third aspect of the present invention, in the second aspect of the present invention, a coefficient of a linear term in the second function is 0, and a value of a constant term in the second function is a maximum value of the expansion coefficient.

According to a fourth aspect of the present invention, in the third aspect of the present invention, one pixel includes a white sub pixel that displays white, a red sub pixel that displays red, a green sub pixel that displays green, and a blue sub pixel that displays blue, and the maximum value of the expansion coefficient is decided as a maximum value of a color value for the white sub pixel.

According to a fifth aspect of the present invention, in the first aspect of the present invention, when a pixel to be processed for obtaining the expansion coefficient is defined as a target pixel, the expansion coefficient decision unit decides an expansion coefficient to be used for the expansion process on an input video signal of the target pixel based on input video signals of a plurality of pixels including the target pixel and pixels around the target pixel.

According to a sixth aspect of the present invention, in the fifth aspect of the present invention, the expansion coefficient decision unit decides expansion coefficients obtained based on input video signals of the plurality of pixels, as tentative expansion coefficients, and decides an average of the tentative expansion coefficients, as an expansion coefficient to be used for the expansion process on an input video signal of the target pixel.

According to a seventh aspect of the present invention, in the fifth aspect of the present invention, the expansion coefficient decision unit decides expansion coefficients obtained based on input video signals of the plurality of pixels, as tentative expansion coefficients, and decides a median of the tentative expansion coefficients, as an expansion coefficient to be used for the expansion process on an input video signal of the target pixel.

According to an eighth aspect of the present invention, in the first aspect of the present invention, the input video signal includes a red input video signal, a green input video signal, and a blue input video signal, the display panel is configured to display an image based on the output video signal including a white output video signal, a red output video signal, a green output video signal, and a blue output video signal, the expanded video signal generation unit:

generates a red expanded video signal based on the red input video signal;

generates a green expanded video signal based on the green input video signal; and generates a blue expanded video signal based on the blue input video signal, the output video signal generation unit:

generates the white output video signal based on the red expanded video signal, the green expanded video signal, and the blue expanded video signal;

generates the red output video signal based on the white output video signal and the red expanded video signal;

generates the green output video signal based on the white output video signal and the green expanded video signal; and generates the blue output video signal based on the white output video signal and the blue expanded video signal.

According to a ninth aspect of the present invention, in the eighth aspect of the present invention, one pixel includes a white sub pixel that displays white, a red sub pixel that displays red, a green sub pixel that displays green, and a blue sub pixel that displays blue, the white output video signal is provided to the white sub pixel, the red output video signal is provided to the red sub pixel, the green output video signal is provided to the green sub pixel, and the blue output video signal is provided to the blue sub pixel.

According to a tenth aspect of the present invention, in the eighth aspect of the present invention, the display panel is driven by a field-sequential color system in which one frame period is divided into a plurality of fields and a screen is rewritten in each of the fields to produce a color display, one frame period includes a white field for displaying a white screen, a red field for displaying a red screen, a green field for displaying a green screen, and a blue field for displaying a blue screen, the white output video signal is outputted to the display panel in the white field, the red output video signal is outputted to the display panel in the red field, the green output video signal is outputted to the display panel in the green field, and the blue output video signal is outputted to the display panel in the blue field.

An eleventh aspect of the present invention is directed to a method for expanding a color space in a display device provided with a display panel for displaying an image, the method including:

an expanded video signal generation step of performing an expansion process for increasing a signal value of an input video signal, and outputting data obtained by the expansion process as an expanded video signal;

an expansion coefficient decision step of deciding an expansion coefficient that is used for the expansion process in the expanded video signal generation step; and an output video signal generation step of generating an output video signal to be outputted to the display panel based on the expanded video signal, wherein in the expansion coefficient decision step, the expansion coefficient is decided based on a first function, which is a function representing an inverse of saturation obtained based on the input video signal, for a pixel with the saturation not smaller than a predetermined value, and the expansion coefficient is decided based on a second function that is a quadratic function, in which saturation obtained based on the input video signal is set to a parameter and a coefficient of a quadratic term is a negative value, for a pixel with the saturation not larger than the predetermined value, and in the expanded video signal generation step, the expansion coefficient, decided in the expansion coefficient decision step, is multiplied by a signal value of the input video signal for each pixel, to generate the expanded video signal.

Effects of the Invention

According to the first aspect of the present invention, in the display device for performing an expansion process, the value of the inverse of the saturation obtained based on the input video signal, or the value obtained based on the quadratic function taking the saturation as a parameter, is decided as the expansion coefficient to be used for the expansion process. Since the value of the inverse of the saturation or the value obtained based on the quadratic function is decided as the expansion coefficient in this manner, differently from the prior art, the constituent for holding the expansion coefficient corresponding to each saturation is unnecessary. Accordingly, it is possible to perform the expansion process on the input video signal without providing the constituent for holding the expansion coefficient corresponding to each saturation. Further, the inverse of the saturation is not uniformly decided as the expansion coefficient, but the expansion coefficient is decided from the inverse of the saturation and the quadratic function, thereby preventing the generation of the killer pattern. From the above, there is achieved a display device capable of expanding a color space without causing an increase in IC size, an increase in cost, and display problems.

According to the second aspect of the present invention, since the curve representing the first function and the curve representing the second function are smoothly connected at the predetermined value, the generation of the killer pattern is effectively prevented.

According to the third aspect of the present invention, the same effect as that of the second aspect of the present invention can be obtained.

According to the fourth aspect of the present invention, the same effect as that of the second aspect of the present invention can be obtained.

According to the fifth aspect of the present invention, the expansion coefficient to be used for the expansion process on an input video signal of a certain pixel is decided based on input video signals of a plurality of pixels including the certain pixel and pixels around the pixel. This prevents a great change in the expansion coefficient value between adjacent pixels. Accordingly, an image with smooth color variation is displayed. From the above, there is achieved a display device capable of expanding a color space without causing an increase in IC size, an increase in cost, and display problems, and also capable of obtaining a display image with smooth color variation.

According to the sixth aspect of the present invention, similarly to the fifth aspect of the present invention, there is achieved a display device capable of expanding a color space without causing an increase in IC size, an increase in cost, and display problems, and also capable of obtaining a display image with smooth color variation.

According to the seventh aspect of the present invention, similarly to the fifth aspect of the present invention, there is achieved a display device capable of expanding a color space without causing an increase in IC size, an increase in cost, and display problems, and also capable of obtaining a display image with smooth color variation.

According to the eighth aspect of the present invention, since a white display is produced, there is achieved a display device capable of effectively expanding a color space without causing an increase in IC size, an increase in cost, and display problems.

According to the ninth aspect of the present invention, there is achieved a display device employing a color filter system and capable of expanding a color space without causing an increase in IC size, an increase in cost, and display problems.

According to the tenth aspect of the present invention, a field-sequential color system is adopted for the driving system of the display panel. By using the field-sequential color system, color filters are not required, thereby making the light use efficiency high as compared with that of the display device employing the color filter system. This enables an increase in luminance and reduction in power consumption. From the above, there is achieved a display device capable of expanding a color space without causing an increase in IC size, an increase in cost, and display problems, and also capable of increasing luminance and reducing power consumption.

According to the eleventh aspect of the present invention, the same effect as that of the first aspect of the present invention can be exerted in the method for expanding a color space in the display device.

MODES FOR CARRYING OUT THE INVENTION

Embodiments of the present invention will be described below with reference to the accompanying drawings. Note that signal values of an input video signal and some other signal are assumed to be not smaller than 0 and not larger than 1.

1. First Embodiment

<1.1 Overall Configuration and Operation Overview>

Figure 2:
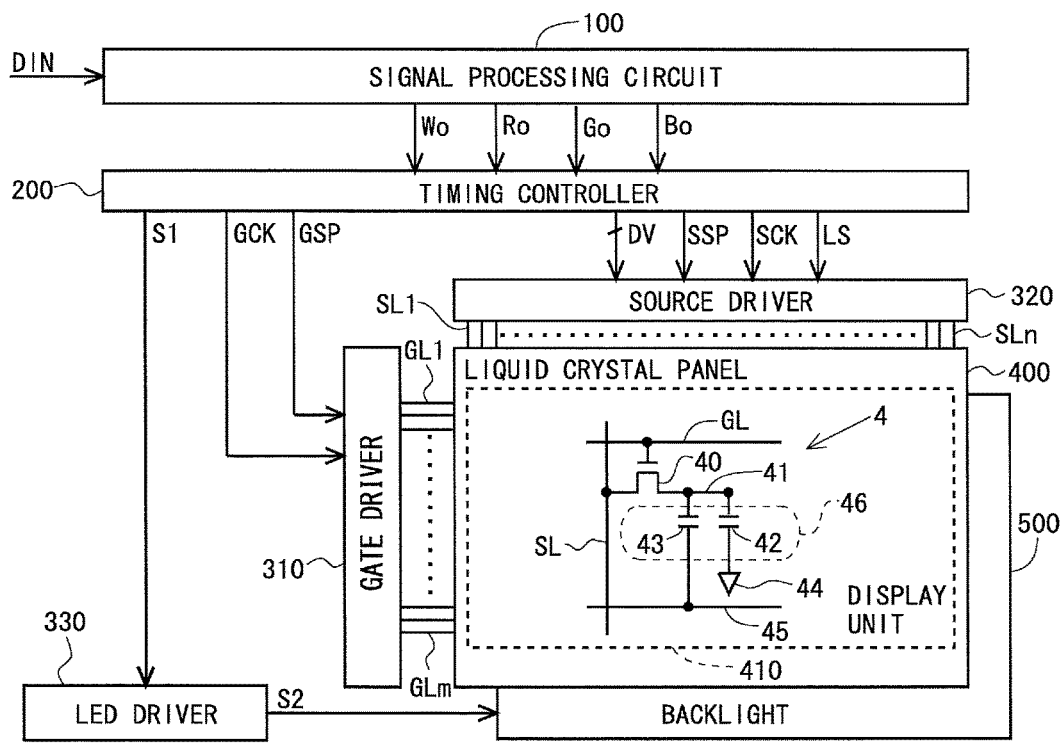
FIG. 2 is a block diagram showing an overall configuration of the liquid crystal display device in the first embodiment.

FIG. 2 is a block diagram showing an overall configuration of a liquid crystal display device according to a first embodiment of the present invention. This liquid crystal display device includes a signal processing circuit 100, a timing controller 200, a gate driver 310, a source driver 320, an LED driver 330, a liquid crystal panel 400, and a backlight 500. The gate driver 310 or the source driver 320, or both of those drivers, may be provided in the liquid crystal panel 400. The liquid crystal panel 400 includes a display unit 410 for displaying an image. In the present embodiment, it is assumed that the backlight 500 is configured by a red LED, a green LED, and a blue LED.

As for FIG. 2, a plurality of (n) source bus lines (video signal lines) SL1 to SLn and a plurality of (m) gate bus lines (scanning signal lines) GL1 to GLm are disposed in the display unit 410. A pixel formation portion 4 which forms a pixel (sub pixel) is provided at a corresponding intersection of the source bus lines SL1 to SLn and the gate bus lines GL1 to GLm. That is, the display unit 410 includes a plurality of (n×m) pixel formation portions 4. The plurality of pixel formation portions 4 are arranged in a matrix form and thereby form a pixel matrix of m rows×n columns. Each pixel formation portion 4 includes a thin-film transistor (TFT) 40 which is a switching element having a gate terminal connected to a gate bus line GL passing through a corresponding intersection, and a source terminal connected to a source bus line SL passing through the intersection; a pixel electrode 41 connected to a drain terminal of the TFT 40; a common electrode 44 and an auxiliary capacitance electrode 45 which are provided so as to be shared by the plurality of pixel formation portions 4; a liquid crystal capacitance 42 formed of the pixel electrode 41 and the common electrode 44; and an auxiliary capacitance 43 formed of the pixel electrode 41 and the auxiliary capacitance electrode 45. A pixel capacitance 46 is composed of the liquid crystal capacitance 42 and the auxiliary capacitance 43. Note that only those components provided in one pixel formation portion 4 are shown in the display unit 410 in FIG. 2.

Meanwhile, as the TFTs 40 in the display unit 410, for example, an oxide TFT (a thin-film transistor using an oxide semiconductor as a channel layer) can be adopted. More specifically, a TFT whose channel layer is formed of indium-gallium-zinc-oxide (In—Ga—Zn—O) that is an oxide semiconductor containing indium (In), gallium (Ga), zinc (Zn), and oxygen (O) as the main components (such a TFT is hereinafter referred to as "In—Ga—Zn—O-TFT") can be adopted as the TFT 40. By adopting such an In—Ga—Zn—O-TFT, the effects of an improvement in definition and a reduction in power consumption can be obtained, and in addition, the writing speed can be increased over conventional cases. Moreover, it is also possible to adopt a transistor using, as a channel layer, an oxide semiconductor other than indium-gallium-zinc-oxide (In—Ga—Zn—O). The same effects are obtained also when a transistor using an oxide semiconductor containing, for example, at least one of indium, gallium, zinc, copper (Cu), silicon (Si), tin (Sn), aluminum (Al), calcium (Ca), germanium (Ge), and lead (Pb) as the channel layer is adopted. Note that the present invention does not intend to exclude the use of other TFTs than oxide TFTs.

Figure 3:
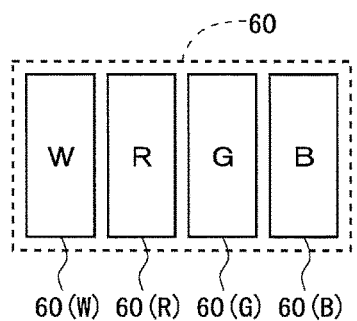
FIG. 3 is a schematic diagram showing a configuration of one pixel in the first embodiment.

FIG. 3 is a schematic diagram showing a configuration of one pixel in the present embodiment. As illustrated in FIG. 3, in the present embodiment, one pixel 60 includes a white sub pixel 60(W) for displaying white, a red sub pixel 60(R) for displaying red, a green sub pixel 60(G) for displaying green, and a blue sub pixel 60(B) for displaying blue. Each of these sub pixels of the respective colors correspond to one pixel formation portion 4 described above. As thus described, the liquid crystal display device according to the present embodiment is a liquid crystal display device employing a color filter system. Note that the configuration shown in FIG. 3 is an example, and the present invention is not limited thereto. The present invention is also applicable to a case where a configuration other than the configuration shown in FIG. 3 is adopted.

Next, operation of the constituents shown in FIG. 2 will be described. The signal processing circuit 100 receives an input video signal DIN, and performs an expansion process for expanding a color space, or some other process. The signal processing circuit 100 then outputs a white output video signal Wo, a red output video signal Ro, a green output video signal Go, and a blue output video signal Bo, to be provided to the liquid crystal panel 400.

The timing controller 200 receives the white output video signal Wo, the red output video signal Ro, the green output video signal Go, and the blue output video signal Bo, and outputs a digital video signal DV including those output video signals of the four colors, a gate start pulse signal GSP and a gate clock signal GCK which are for controlling operation of the gate driver 310, a source start pulse signal SSP, a source clock signal SCK, and a latch strobe signal LS which are for controlling operation of the source driver 320, and an LED driver control signal S1 for controlling operation of the LED driver 330.

The gate driver 310 repeats the application of an active scanning signal to each gate bus line GL with one vertical scanning period as a cycle, based on the gate start pulse signal GSP and gate clock signal GCK which are transmitted from the timing controller 200.

The source driver 320 receives the digital video signals DV, source start pulse signal SSP, source clock signal SCK, and latch strobe signal LS which are transmitted from the timing controller 200, and applies a driving video signal to each source bus line SL. At this time, the source driver 320 sequentially holds a digital video signal DV indicating a voltage to be applied to each source bus line SL, at timing at which a pulse of the source clock signal SCK occurs. Then, the held digital video signals DV are converted into analog voltages at timing at which a pulse of the latch strobe signal LS occurs. The converted analog voltages are simultaneously applied to all source bus lines SL1 to SLn, as driving video signals.

The LED driver 330 outputs a light source control signal S2 for controlling luminance of each LED that constitutes the backlight 500, based on the LED driver control signal S1 transmitted from the timing controller 200. The backlight 500 controls the luminance of each LED based on the light source control signal S2.

As described above, the scanning signals are applied to the gate bus lines GL1 to GLm, the driving video signals are applied to the source bus lines SL1 to SLn, and the luminance of each LED is controlled, by which an image corresponding to the input video signal DIN is displayed on the display unit 410 of the liquid crystal panel 400.

<1.2 Signal Processing Circuit>

Figure 1:
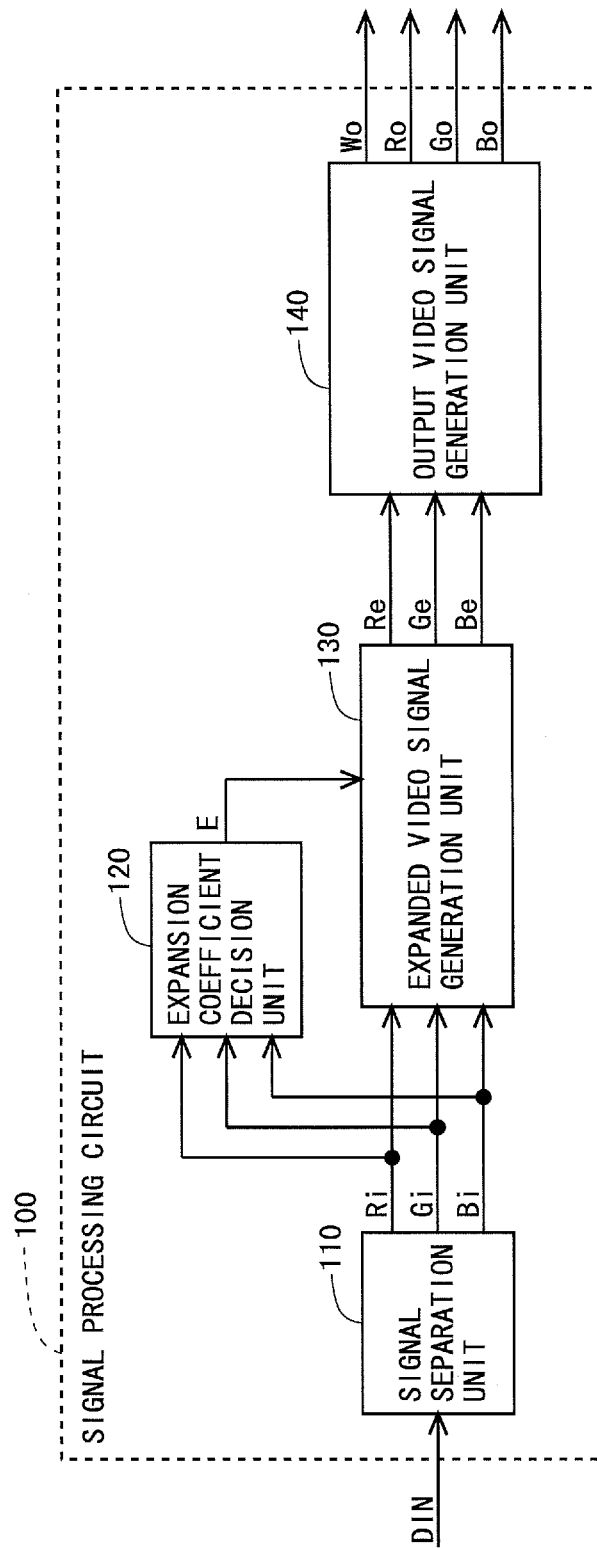
FIG. 1 is a block diagram showing a configuration of a signal processing circuit in a liquid crystal display device according to a first embodiment of the present invention.

Next, the configuration and operation of the signal processing circuit 100 will be described in detail. FIG. 1 is a block diagram showing the configuration of the signal processing circuit 100 according to the present embodiment. The signal processing circuit 100 includes a signal separation unit 110, an expansion coefficient decision unit 120, an expanded video signal generation unit 130, and an output video signal generation unit 140.

The signal separation unit 110 separates the input video signal DIN transmitted from the outside into a red input video signal Ri being a red component, a green input video signal Gi being a green component, a blue input video signal Bi being a blue component. The expansion coefficient decision unit 120 obtains, for each pixel, an expansion coefficient E to be used for the expansion process based on the red input video signal Ri, the green input video signal Gi, and the blue input video signal Bi. A method of obtaining this expansion coefficient E will be described in detail later. The expanded video signal generation unit 130 multiples each of the red input video signal Ri, the green input video signal Gi, and the blue input video signal Bi by the expansion coefficient E, to generate a red expanded video signal Re, a green expanded video signal Ge, and a blue expanded video signal Be. The output video signal generation unit 140 performs a process (hereinafter referred to as a "white separation process") for separating white data from the RGB data including the red expanded video signal Re, the green expanded video signal Ge, and the blue expanded video signal Be, to generate the white output video signal Wo, the red output video signal Ro, the green output video signal Go, and the blue output video signal Bo which are to be outputted to the liquid crystal panel 400.

Figure 4:
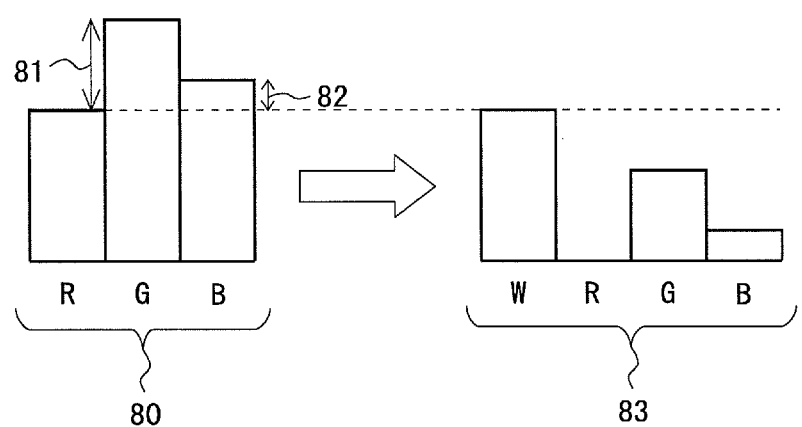
FIG. 4 is a diagram for describing data conversion by a white separation process in the first embodiment.

Specific examples of conversion of data by the white separation process will be described here. A first example and a second example will be described as specific examples, but the present invention is not limited thereto. For example, components for the respective colors (signal values of the expanded video signals for the respective colors) before the conversion are assumed to be like those denoted by reference character 80 in FIG. 4. Among the red component (R), the green component (G), and the blue component (B), the red component is the minimum component.

In such a case, in the first example, the size of the white component (W) is set to be the same as the size of the red component before the conversion. The size of the green component after the conversion is set to be a size shown by an arrow of reference character 81 in FIG. 4, and the size of the blue component after the conversion is set to be a size shown by an arrow of reference character 82 in FIG. 4. It should be noted that, at this time, the size of the red component after the conversion is set to be zero. As a result, the components for the respective colors after the conversion are as those shown by reference character 83 in FIG. 4. As described above, when the size of the red component, the size of the green component, and the size of the blue component before the white separation process are respectively represented by R1, G1, and B1, and the size of the white component, the size of the red component, the size of the green component, and the size of the blue component after the white separation process are respectively represented by W2, R2, G2, and B2, W2, R2, G2, and B2 are respectively obtained by the following formulas (1), (2), (3), and (4):

$$W2 = \min(R1, G1, B1) \tag{1}$$

$$R2 = R1 - W2 \tag{2}$$

$$G2 = G1 - W2 \tag{3}$$

$$B2 = B1 - W2 \tag{4}$$

where min(R1, G1, B1) is a function representing the minimum value among R1, G1, and B1.

In the second example, the size of the white component (W) is set to be a size obtained by multiplying the size of the red component before the conversion by a predetermined coefficient C. That is, a size W2 of the white component after the white separation process is obtained by the following formula (5):

$$W2 = C \times \min(R1, G1, B1) \tag{5}$$

Based on W2 obtained as above, similarly to the first example, the size of the red component, the size of the green component, and the size of the blue component after the white separation process are obtained.

<1.3 Expansion Process>

Figure 5:
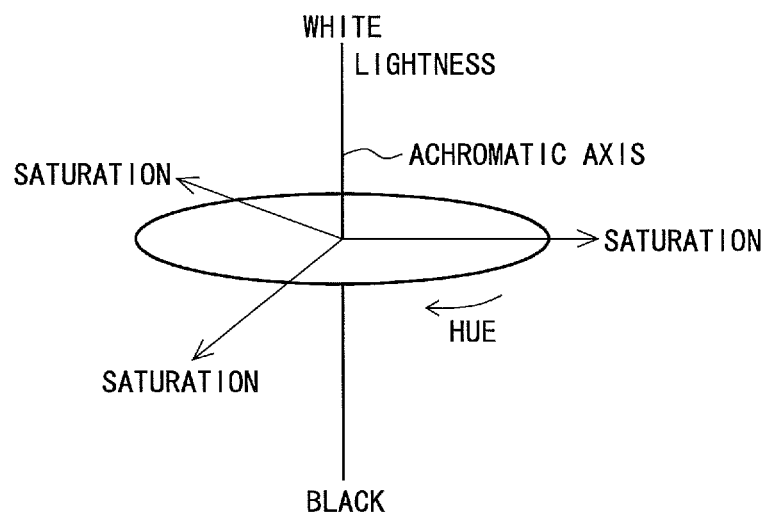
FIG. 5 is a diagram for describing three psychological attributes of color.
Figure 6:
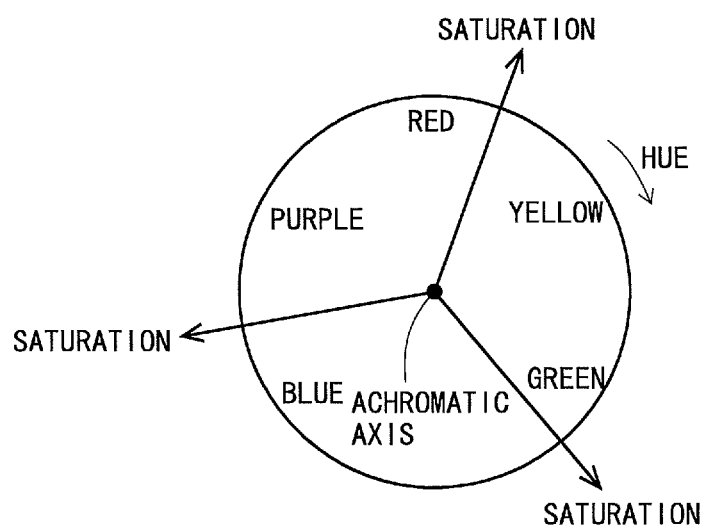
FIG. 6 is a diagram for describing hue.

As described above, in order to expand the color space, the expansion process is performed in which the signal value of the input video signal is multiplied by the expansion coefficient E which is a constant coefficient. Meanwhile, a variety of color spaces have hitherto been considered for performing a variety of processes concerning colors. In the present embodiment, the expansion process is performed using an HSV color space. The HSV color space is a color space made up of three components of "hue", "saturation", and "lightness." These hue, saturation and lightness are called three psychological attributes of color. The hue is a color shade such as "red . . . yellow . . . green . . . blue . . . purple." The lightness is the degree of brightness of color. The saturation is the degree of color vividness. These three psychological attributes are generally illustrated as shown in FIG. 5. In FIG. 5, the lightness is shown in a vertical direction, and a vertical line represents an achromatic axis. The higher the position on the achromatic axis the higher the lightness, and the lower the position on the achromatic axis the lower the lightness. Further, the greater the distance from the achromatic axis, the higher the saturation. The hue is represented by a circumference with the achromatic axis at the center. As shown in FIG. 6, colors such as "red . . . yellow . . . green . . . blue . . . purple" are present around the achromatic axis. As described above, the hue represents a color shade, and the saturation represents the color vividness. On the other hand, the lightness merely represents the brightness of color. It is thus considered that an impression a person gets from a displayed image greatly changes when the hue or the saturation changes rather than when the lightness changes. Accordingly, the expansion process is performed as described below to increase only the lightness without changing the hue or the saturation. It should be noted that, in the following, signal values of the red input video signal Ri, the green input video signal Gi, and the blue input video signal Bi are simply referred to as Ri, Gi and Bi. Further, the value of the expansion coefficient E is simply referred to as E.

Figure 7:
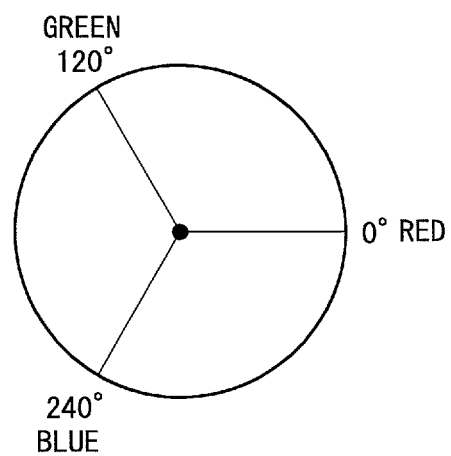
FIG. 7 is a diagram for describing hue.

Concerning the input video signal DIN, the hue H is expressed by the following formula (6) when Ri is the minimum, the hue H is expressed by the following formula (7) when Gi is the minimum, and the hue H is expressed by the following formula (8) when Bi is the minimum. Here, max (Ri, Gi, Bi) is a function representing the maximum value among Ri, Gi, and Bi, and min(Ri, Gi, Bi) is a function representing the minimum value among Ri, Gi, and Bi. As shown in FIG. 7, it is assumed that red, green, and blue correspond to 0 degree, 120 degrees, and 240 degrees, respectively.

[Formula 1]

$$H = \frac{60 \times (Bi - Gi)}{\max(Ri, Gi, Bi) - \min(Ri, Gi, Bi)} + 180 \quad (6)$$

[Formula 2]

$$H = \frac{60 \times (Ri - Bi)}{\max(Ri, Gi, Bi) - \min(Ri, Gi, Bi)} + 300 \quad (7)$$

[Formula 3]

$$H = \frac{60 \times (Gi - Ri)}{\max(Ri, Gi, Bi) - \min(Ri, Gi, Bi)} + 60 \quad (8)$$

Further, concerning the input video signal DIN, the saturation S is expressed by the following formula (9):

[Formula 4]

$$S = \frac{\max(Ri, Gi, Bi) - \min(Ri, Gi, Bi)}{\max(Ri, Gi, Bi)} \quad (9)$$

From the above formulas (6) and (9), it is grasped that, even when each of Ri, Gi, and Bi is multiplied by a constant coefficient, the hue H and the saturation S remain unchanged.

Further, concerning the input video signal DIN, the lightness V is expressed by the following formula (10):

$$V = \max(Ri, Gi, Bi) \quad (10)$$

Therefore, the lightness Ve obtained by the expansion process in which the signal value of each color contained in the input video signal DIN is multiplied by the expansion coefficient E is expressed by the following formula (11):

$$Ve = E \times \max(Ri, Gi, Bi) \quad (11)$$

From the above, the expansion process is performed on the input video signal DIN by using the expansion coefficient E whose value is larger than 1, thereby allowing an increase in only the lightness without changing the hue or the saturation. In the present embodiment, the expanded video signal generation unit 130 performs the expansion process as thus described. The expanded video signal generation unit 130 then outputs data obtained by the expansion process as the expanded video signals (the red expanded video signal Re, the green expanded video signal Ge, and the blue expanded video signal Be).

<1.4 Method for Deciding Expansion Coefficient>

Figure 20:
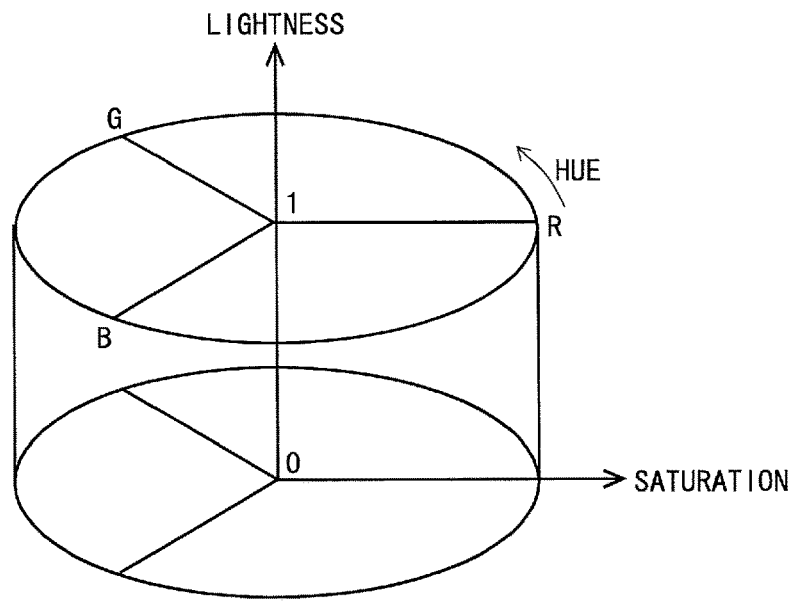
FIG. 20 is a schematic view showing a normal HSV color space.
Figure 21:
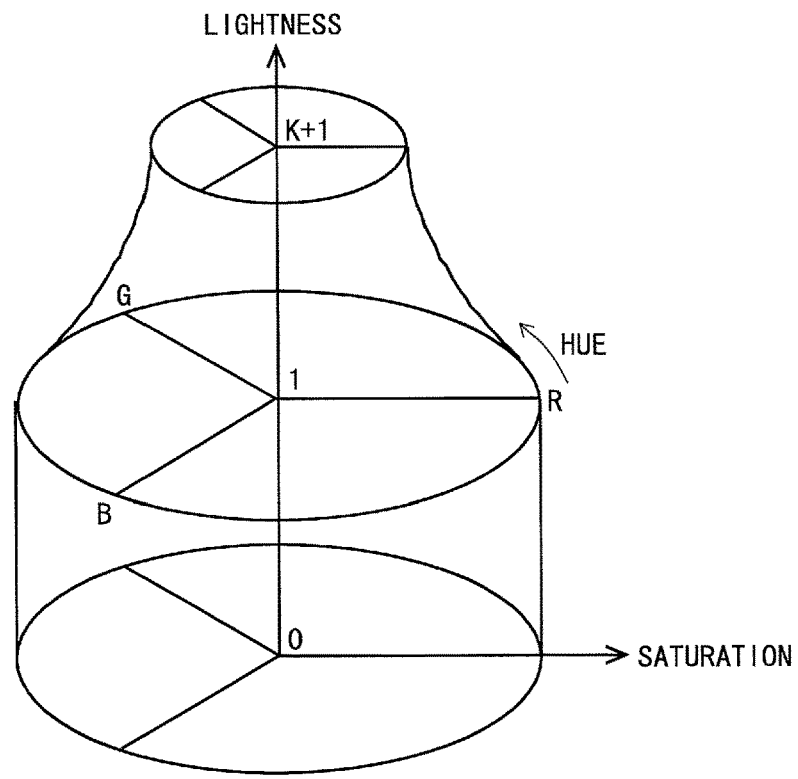
FIG. 21 is a schematic view showing an expanded HSV color space.

As described above, by providing the white sub pixel, the HSV color space can be expanded from one as shown in FIG. 20 to one as shown in FIG. 21. The value of the expansion coefficient E for expanding the color space as above is the maximum lightness corresponding to each saturation S based on the input video signal DIN. Therefore, in the image display device disclosed in Japanese Patent Application Laid-Open No. 2010-33009, the maximum lightness with saturation taken as a variable is previously stored into the signal processing unit, and an expansion coefficient is decided based on saturation obtained from an input video signal and the maximum lightness stored in the signal processing unit. In contrast, in the present embodiment, for a pixel at which the saturation S obtained from the input video signal DIN is not smaller than a predetermined value, the inverse of the saturation S is decided as the expansion coefficient E, and for a pixel at which the saturation S obtained from the input video signal DIN is not larger than the predetermined value, the expansion coefficient E is decided based on a quadratic function taking the saturation S as a parameter. The reason for deciding the expansion coefficient E in this manner will be described below.

First, a description will be given of the reason for simply deciding the inverse of the saturation S as the expansion coefficient E for the pixel at which the saturation S obtained from the input video signal DIN is not smaller than the predetermined value. In general, the signal value of white is obtained based on the expanded video signal (data obtained by performing the expansion process on the input video signal). Typically, the signal value of white (the signal value of the white output video signal Wo) is made equal to the minimum value among the signal value of the red expanded video signal Re, the signal value of the green expanded video signal Ge, and the signal value of the blue expanded video signal Be. The signal value of the output video signal for each color is set at a difference between the signal value of the expanded video signal for the relevant color and the signal value of the white output video signal Wo.

Meanwhile, the liquid crystal cannot be driven by a value exceeding the maximum output value, and hence the signal value of the output video signal needs to be not larger than 1. Therefore, the maximum value among the signal value of the red output video signal Ro, the signal value of the green output video signal Go, and the signal value of the blue output video signal Bo needs to be not larger than 1. In other words, a difference between the maximum value of the expanded video signals (the maximum value among the signal value of the red expanded video signal Re, the signal value of the green expanded video signal Ge, and the signal value of the blue expanded video signal Be) and the signal value of white (the signal value of the white output video signal Wo) needs to be not larger than 1 (the maximum output value). Here, as described above, the signal value of white (the signal value of the white output video signal Wo)

is made equal to the minimum value among the signal value of the red expanded video signal Re, the signal value of the green expanded video signal Ge, and the signal value of the blue expanded video signal Be. Hence, the following formula (12) should be established:

[Formula 5]

$$E \times \max(Ri, Gi, Bi) - E \times \min(Ri, Gi, Bi) \leq 1 \quad (12)$$

From the above formula (12), the following formula (13) should be established concerning the expansion coefficient E:

[Formula 6]

$$E \leq \frac{1}{\max(Ri, Gi, Bi) - \min(Ri, Gi, Bi)} \quad (13)$$

The lightness Ve obtained by the expansion process can be expressed by the above formula (11), and hence the expansion coefficient E is expressed by the following formula (14):

[Formula 7]

$$E = \frac{Ve}{\max(Ri, Gi, Bi)} \quad (14)$$

When the above formula (14) is substituted for the above formula (13), the following formula (15) is obtained:

[Formula 8]

$$\frac{Ve}{\max(Ri, Gi, Bi)} \leq \frac{1}{\max(Ri, Gi, Bi) - \min(Ri, Gi, Bi)} \quad (15)$$

Concerning the lightness Ve, the following formula (16) is obtained from the above formula (15):

[Formula 9]

$$Ve \leq \frac{\max(Ri, Gi, Bi)}{\max(Ri, Gi, Bi) - \min(Ri, Gi, Bi)} \quad (16)$$

Thus, "Ve's maximum value (maximum lightness) Vmax" in a case in which the saturation S is based on the input video signal DIN is expressed by the following formula (17).

[Formula 10]

$$Vmax = \frac{\max(Ri, Gi, Bi)}{\max(Ri, Gi, Bi) - \min(Ri, Gi, Bi)} \quad (17)$$

The saturation S is expressed by the above formula (9), and hence it is grasped that the right side of the above formula (17) is an inverse of the saturation S. Further, as described above, the value of the expansion coefficient E is the maximum lightness corresponding to each saturation S based on the input video signal DIN. Accordingly, above Vmax is the expansion coefficient E, and its value is the inverse of the saturation S. From the above, it is grasped that the inverse of the saturation obtained from the input video signal DIN is preferably decided as the expansion coefficient E. However, the maximum value of the expansion coefficient E becomes the maximum lightness ((K+1) in FIG. 21) for the white sub pixel.

However, when the inverse of the saturation is decided as the expansion coefficient E irrespective of the signal value of the input video signal DIN, a killer pattern (an image unable to perform an aimed display) occurs. This will be described below with reference to FIGS. 8 to 13.

Figure 8:
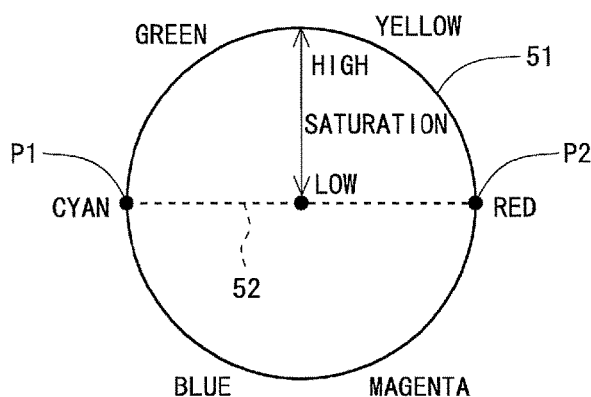
FIG. 8 is a diagram for describing the generation of the killer pattern in the case where the inverse of the saturation is uniformly decided as the expansion coefficient.
Figure 9:
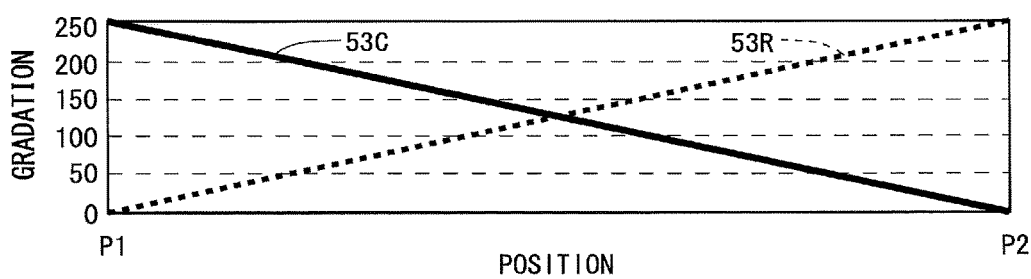
FIG. 9 is a diagram for describing the generation of the killer pattern in the case where the inverse of the saturation is uniformly decided as the expansion coefficient.
Figure 10:
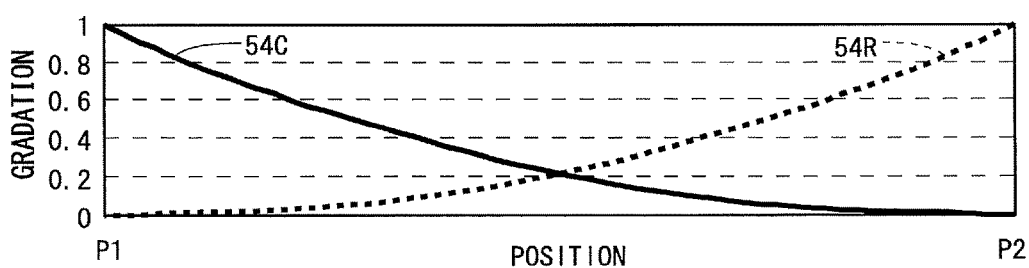
FIG. 10 is a diagram for describing the generation of the killer pattern in the case where the inverse of the saturation is uniformly decided as the expansion coefficient.

Here, displaying a circular image 51 with a color shade as shown in FIG. 8 is considered. Concerning this circular image 51, the saturation decreases as getting closer to the center, and the saturation increases as getting farther from the center. Attention is focused on data on a dotted line (a dotted line connecting between a position P1 and a position P2) denoted by reference character 52 in the circular image 51. A gradation of a cyan component is represented by a solid line denoted by reference character 53C in FIG. 9. A gradation of a red component is represented by a dotted line denoted by reference character 53R in FIG. 9. Here, when the gradation data is converted to luminance data with a gamma value of the liquid crystal panel 400 set to 2.2, the luminance of the cyan component is represented by a solid line denoted by reference character 54C in FIG. 10, and the luminance of the red component is represented by a dotted line denoted by reference character 54R in FIG. 10. It should be noted that FIG. 10 shows values having been normalized such that the maximum luminance is 1.

Figure 11:
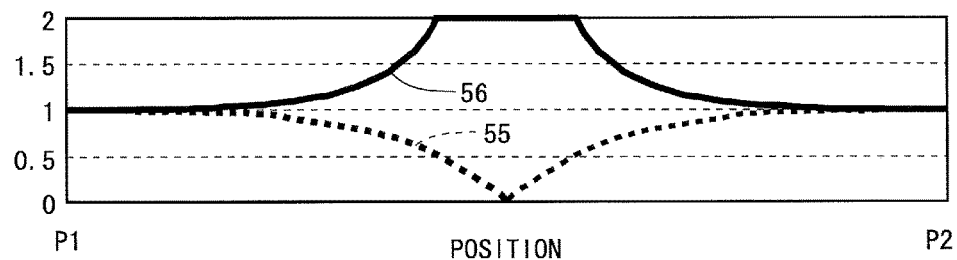
FIG. 11 is a diagram for describing the generation of the killer pattern in the case where the inverse of the saturation is uniformly decided as the expansion coefficient.
Figure 12:
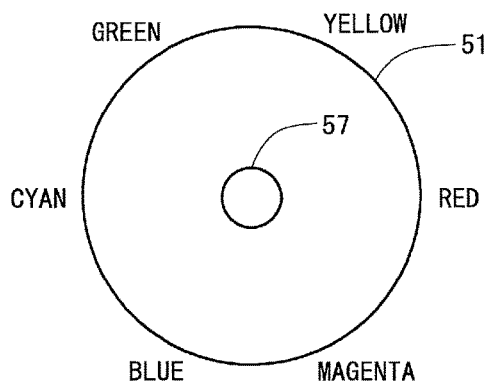
FIG. 12 is a diagram for describing the generation of the killer pattern in the case where the inverse of the saturation is uniformly decided as the expansion coefficient.

The saturation of data on the dotted line denoted by reference character 52 in FIG. 8 is represented by a dotted line denoted by reference character 55 in FIG. 11. At this time, when the inverse of the saturation is uniformly decided as the expansion coefficient (here, the maximum value of the expansion coefficient is set to 2), the expansion coefficient of the data on the dotted line denoted by reference character 52 in FIG. 8 is represented by a solid line denoted by reference character 56 in FIG. 11. When the image display (the display of the circular image 51 shown in FIG. 8) is performed based on the data obtained by the expansion process by using the expansion coefficient as thus described, a white circle appears in the vicinity of the center of the display image (such a circle as shown by a solid line denoted by reference character 57 in FIG. 12 is viewed). The reason for appearance of such a white circle is as follows.

Figure 13:
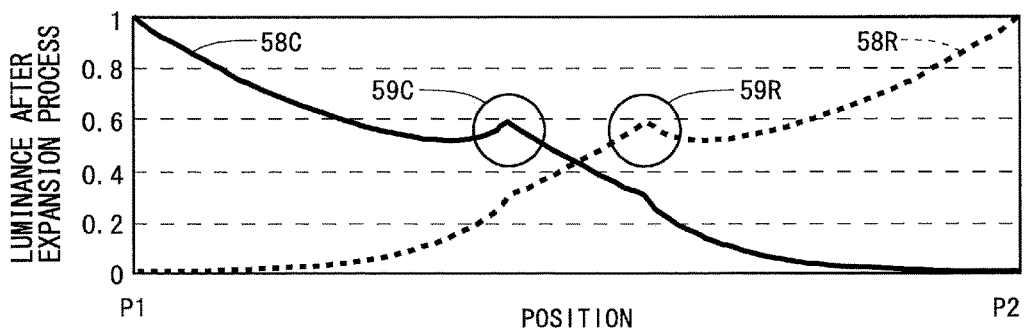
FIG. 13 is a diagram for describing the generation of the killer pattern in the case where the inverse of the saturation is uniformly decided as the expansion coefficient.

In the above example, the luminance of the cyan component after the expansion process is represented by a solid line denoted by reference character 58C in FIG. 13, and the luminance of the red component after the expansion process is represented by a dotted line denoted by reference character 58R in FIG. 13. Although the luminance of the cyan component originally needs to decrease monotonously from the position P1 to the position P2, the luminance has become higher than original at a portion denoted by reference character 59C in FIG. 13. Although the luminance of the red component originally needs to decrease monotonously from the position P2 to the position P1, the luminance has become higher than original at a portion denoted by reference character 59R in FIG. 13. Similarly, luminance of a color component other than the cyan component and the red component also becomes higher than original in the vicinity of the center of the circular image 51. The luminance of each color component becomes higher than original in the vicinity of the center of the circular image 51 in this manner, thereby leading to appearance of the white circle in the vicinity of the center of the display image.

Hence, in the present embodiment, regarding the method of obtaining the expansion coefficient E, cases are divided based on the magnitude of the saturation S obtained from the input video signal DIN. Specifically, concerning data of each pixel, when the saturation S that is obtained based on the input video signal DIN is not smaller than a predetermined value, the inverse of the saturation S is decided as the expansion coefficient E, and when the saturation S that is obtained based on the input video signal DIN is not larger than the predetermined value, the expansion coefficient E is obtained based on a predetermined quadratic function. This will be described in detail below.

Figure 14:
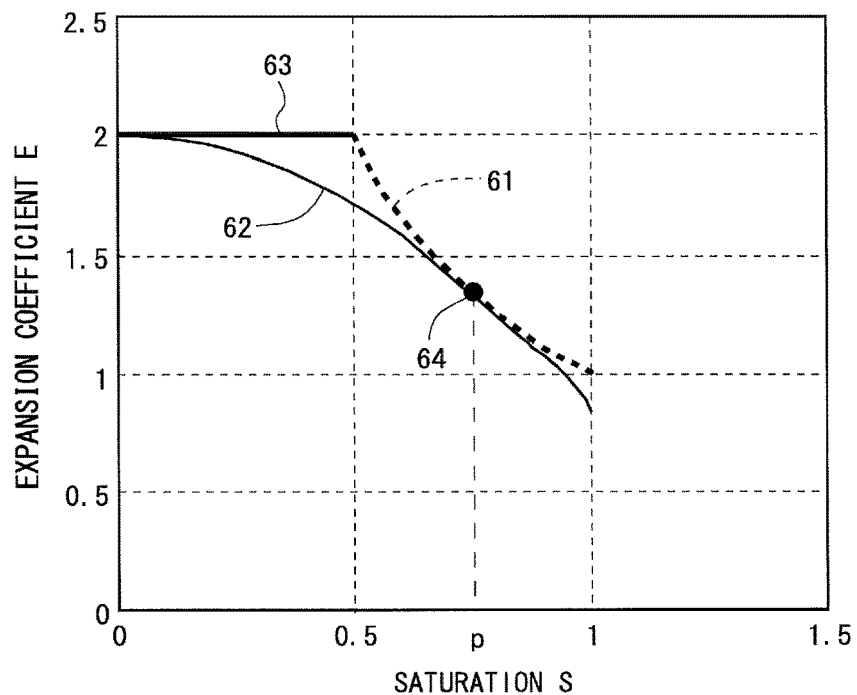
FIG. 14 is a diagram for describing the methods of obtaining the expansion coefficient in the first embodiment.

FIG. 14 is a diagram for describing the methods of obtaining the expansion coefficient E in the present embodiment. Regarding this FIG. 14, the horizontal axis represents the saturation S that is obtained based on the input video signal DIN, and the vertical axis represents the expansion coefficient E. In FIG. 14, a dotted line (curve) denoted by reference character 61 shows a function (referred to as a "first function" for convenience sake) representing the inverse of the saturation, and a solid line (curve) denoted by reference character 62 shows a quadratic function (referred to as a "second function" for convenience sake) in which saturation is set to a parameter and a coefficient of a quadratic term is a negative value. Note that the solid line denoted by reference character 63 shows the maximum value of the expansion coefficient E (a specific value here is 2).

A first function f(S) is represented by the following formula (18), and a second function g(S) is represented by the following formula (19).

[Formula 11]

$$f(S) = \frac{1}{S} \qquad (18)$$

[Formula 12]

$$g(S) = zS^2 + 2 \qquad (19)$$

It is assumed here that a curve 61 representing "E=f(S)" and a curve 62 representing "E=g(S)" are smoothly connected at "S=p." (In FIG. 14, the connection point is denoted by reference character 64.) At this time, the following formula (20) and the following formula (21) are established. Note that the left side of the following formula (21) represents a differential coefficient at "S=p" on "E=f(S)", and the right side of the following formula (21) represents a differential coefficient at "S=p" on "E=g(S)." That is, the following formula (21) means that the differential coefficient (slope) of "E=f(S)" is equal to the differential coefficient (slope) of "E=g(S)" at "S=p".

$$f(p)=g(p) \qquad (20)$$

[Formula 13]

$$\frac{df(p)}{dS} = \frac{dg(p)}{dS} \qquad (21)$$

The following formula (22) is established from the above formula (18), the above formula (19), and the above formula (20). The following formula (23) is established from the above formula (18), the above formula (19), and the above formula (21).

[Formula 14]

$$\frac{1}{p} = zp^2 + 2 \qquad (22)$$

[Formula 15]

$$-\frac{1}{p^2} = 2zp \qquad (23)$$

When simultaneous equations made up of the above formula (22) and the above formula (23) are solved, solutions of "p=¾" and "z=−32⁄27" (z is the coefficient of the quadratic term in the second function g(S)) are obtained. Thus, in the present embodiment, a function represented by the following formula (24) is used as the second function g(S). Then, the curve representing the first function f(S) shown by the above formula (18) and the curve representing the second function g(S) shown by the following formula (24) are smoothly connected at "S=¾".

[Formula 16]

$$g(S) = -\frac{32}{27}S^2 + 2 \qquad (24)$$

Figure 15:
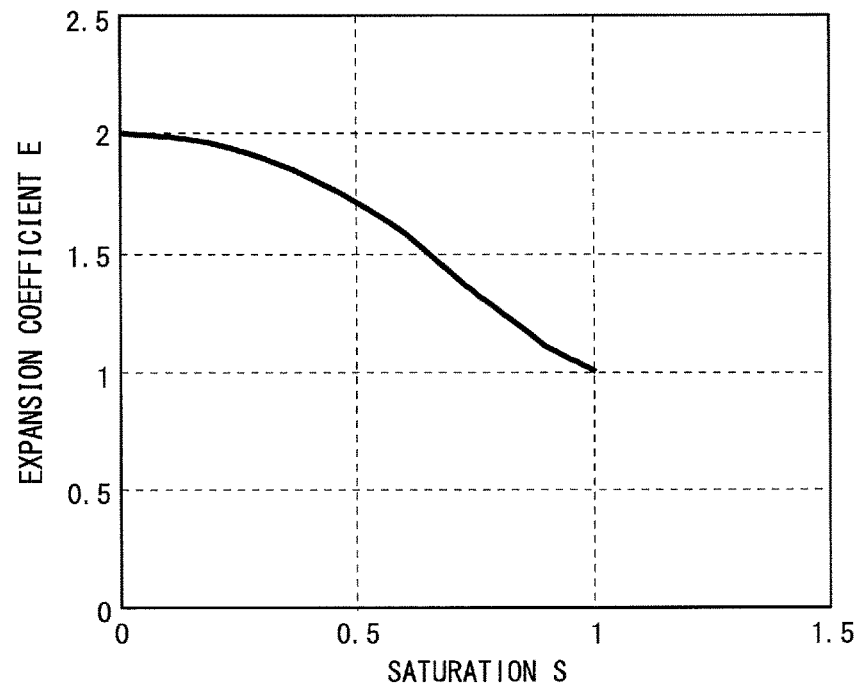
FIG. 15 is a diagram for describing the methods of obtaining the expansion coefficient in the first embodiment.

Then, in the present embodiment, when the saturation S that is obtained based on the input video signal DIN is not smaller three-fourths, the expansion coefficient decision unit 120 decides the expansion coefficient E based on the first function f(S) shown by the above formula (18), and when the saturation S that is obtained based on the input video signal DIN is not larger three-fourths, the expansion coefficient decision unit 120 decides the expansion coefficient E based on the second function g(S) shown by the above formula (24). That is, in the present embodiment, the expansion coefficient E is decided in accordance with the saturation S based on the curve as shown in FIG. 15.

Figure 16:
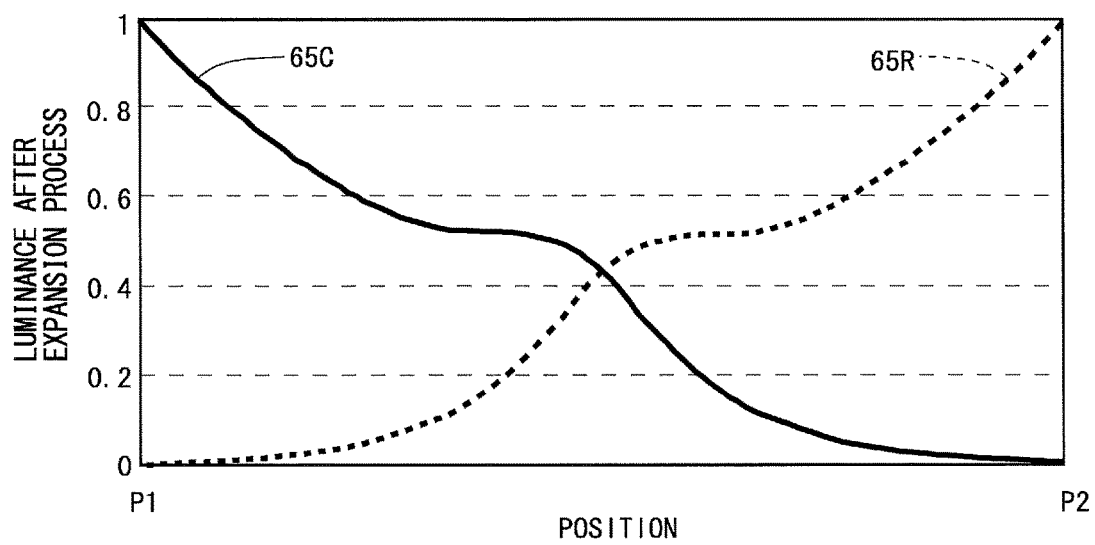
FIG. 16 is a diagram for describing the luminance after the expansion process in the case where an image represented by the input video signal is an image as shown in FIG. 8, in the first embodiment.

When the expansion process is performed using the expansion coefficient E having been decided as described above at the time of displaying the circular image 51 as shown in FIG. 8, the luminance of the cyan component after the expansion process is represented by a solid line denoted by reference character 65c in FIG. 16, and the luminance of the red component after the expansion process is represented by a dotted line denoted by reference character 65R in FIG. 16. As grasped from FIG. 16, the luminance of the cyan component monotonously decreases from the position P1 toward the position P2, and the luminance of the red component monotonously decreases from the position P2 toward the position P1. A similar luminance change is also obtained in a color component other than the cyan component and the cyan component. As a result, an image close to an aimed display image is displayed. The generation of the killer pattern is prevented in such a manner as described above.

In the present embodiment, the coefficient z of the quadratic term in the second function g(S) is obtained such that the slopes of both functions are the same at the connection point between the curve representing the first function f(S) and the curve representing the second function g(S). However, the present invention is not limited thereto. The slopes of both functions at the connection point are not necessarily matched so long as the change of the slopes at the connection point of both functions is not steep.

<1.5 Effects>

Figure 17:
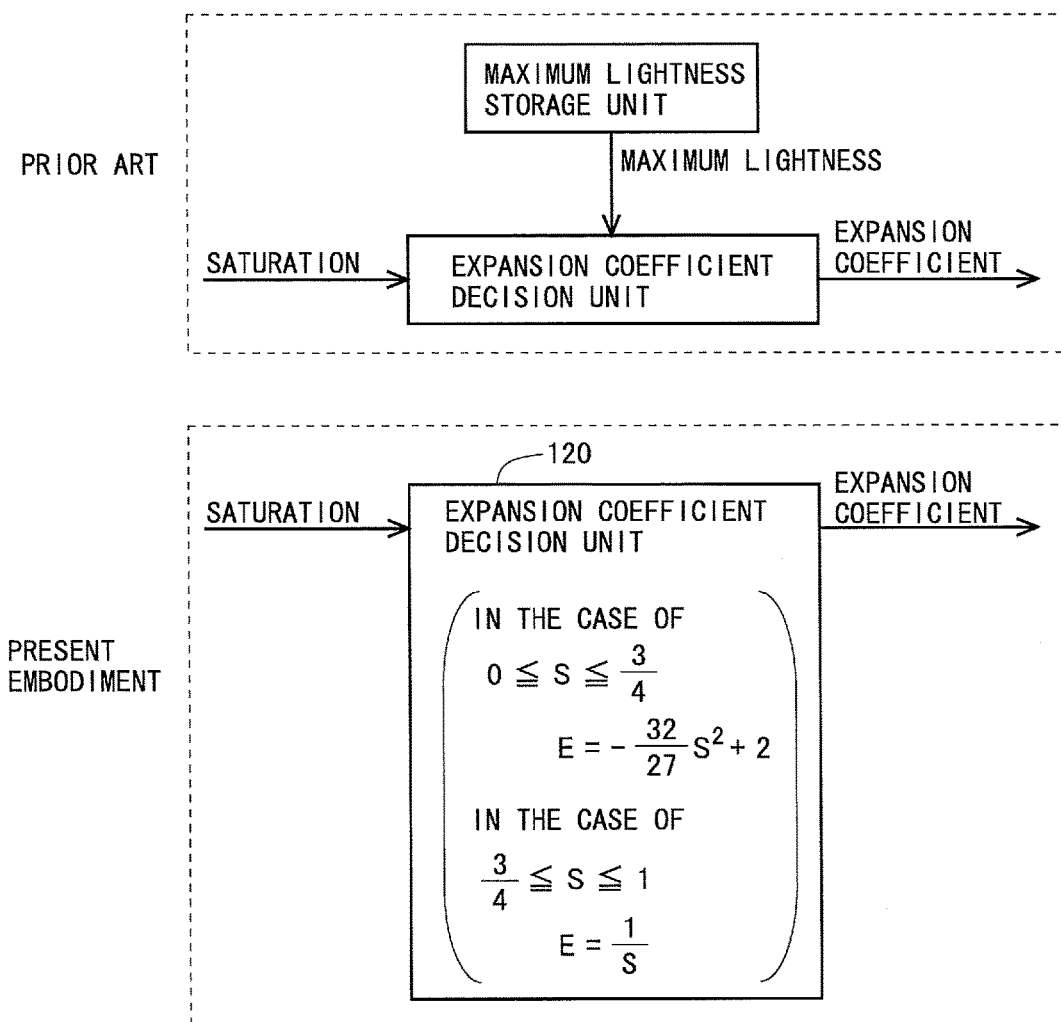
FIG. 17 is a diagram for describing the effect in the first embodiment.

In the prior art, when the expansion process is to be performed on the input video signal so as to expand the color space, the expansion coefficient corresponding to each saturation is previously held, and the expansion coefficient to be used for the expansion process is decided in accordance with saturation obtained from the input video signal. That is, in the prior art, the constituent for holding an expansion coefficient corresponding to each saturation (a maximum lightness storage unit of FIG. 17) has been required. In contrast, according to the present embodiment, in the liquid crystal display device for performing the expansion process on the input video signal so as to expand the color space, the value of the inverse of the saturation obtained based on the input video signal, or the value obtained based on the quadratic function taking the saturation as a parameter, is decided as the expansion coefficient to be used for the expansion process. Hence, in the present embodiment, it is sufficient for the expansion coefficient decision unit 120 to be able to calculate the inverse of the saturation obtained from the input video signal and perform calculation using the quadratic function. Therefore, differently from the prior art, the constituent for holding the expansion coefficient corresponding to each saturation is not provided (cf. FIG. 17). As thus described, according to the present embodiment, it is possible to perform the expansion process on the input video signal without providing the constituent for holding the expansion coefficient corresponding to each saturation. Further, the inverse of the saturation is not uniformly decided as the expansion coefficient, but the expansion coefficient is decided from the inverse of the saturation and the quadratic function, thereby preventing the generation of the killer pattern. That is, there occurs no problem on display. From the above, according to the present embodiment, there is achieved a display device capable of expanding a color space without causing an increase in IC size, an increase in cost, and display problems.

2. Second Embodiment

<2.1 Overview>

In the above first embodiment, the expansion coefficient E for a certain pixel (hereinafter referred to as a "target pixel") is decided based only on a value of an input video signal for the target pixel. However, in a case in which the expansion coefficient E is decided in this manner, at the time of the expansion coefficients E being greatly different between adjacent pixels, color variation concerning the display image may not be smooth. Hence, in the present embodiment, the configuration capable of obtaining a display image with smooth color variation is adopted. It should be noted that, since the overall configuration and the configuration of the signal processing circuit 100 are the same as those of the first embodiment described above, the descriptions thereof are omitted (see FIGS. 1 to 3).

<2.2 Method of Obtaining Expansion Coefficient>

In the above first embodiment, the expansion coefficient E for the target pixel is decided based on the signal value of the input video signal for the target pixel. In contrast, in the present embodiment, the expansion coefficient E for the target pixel is decided based on signal values of input video signals for a plurality of pixels including the target pixel and pixels therearound. Specifically, the expansion coefficient decision unit 120 first obtains "tentative expansion coefficients" based on the signal values of the input video signals for the plurality of pixels including the target pixel and the pixels therearound in the same manner as the first embodiment. The expansion coefficient decision unit 120 then decides an average of the "tentative expansion coefficients" for the plurality of pixels, as the expansion coefficient E for the target pixel.

Figure 18:
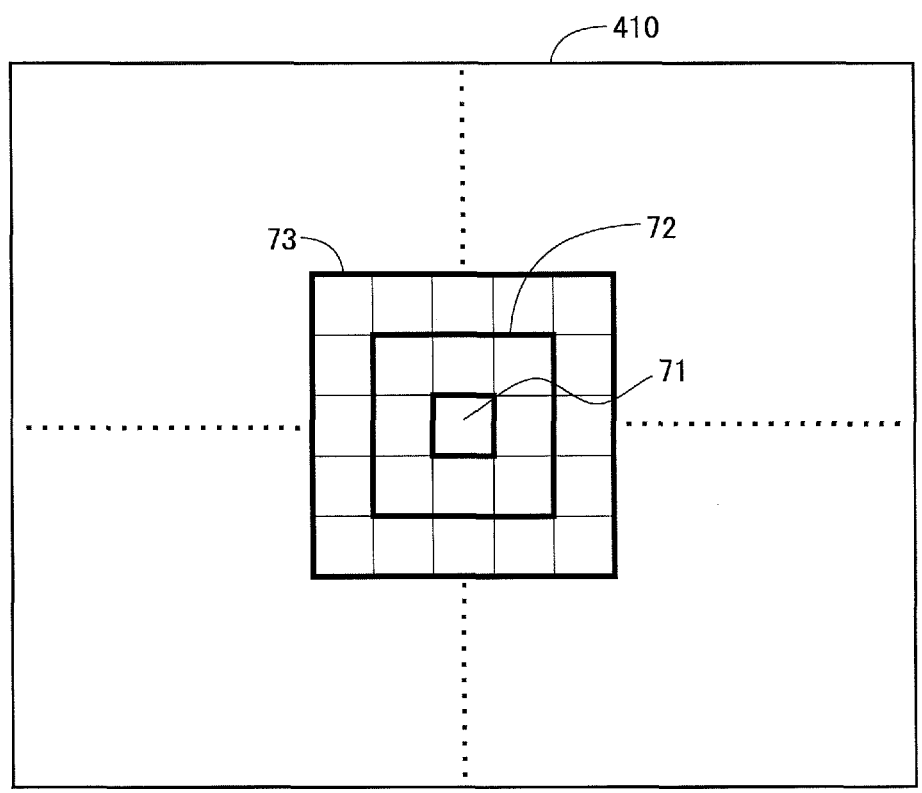
FIG. 18 is a diagram for describing a method of obtaining an expansion coefficient in a liquid crystal display device according to a second embodiment of the present invention.

Assuming that a pixel denoted by reference character 71 in FIG. 18 is the target pixel, for example, the above average (the average of the tentative expansion coefficients) is calculated by using signal values of input video signals DIN for pixels in a range denoted by reference character 72 in FIG. 18. Note that the average may be calculated by using signal values of input video signals DIN for pixels in a range denoted by reference character 73 in FIG. 18, or the average may be calculated by using signal values of input video signals DIN for pixels in a range other than the above range.

In the present embodiment, the expansion process for expanding the signal value is performed on the input video signal DIN of each pixel by using the expansion coefficient E obtained as described above. Note that a median of the "tentative expansion coefficients" for the plurality of pixels including the target pixel and the pixels therearound may be decided as the expansion coefficient E.

<2.3 Effects>

According to the present embodiment, the value of the expansion coefficient E to be used for the expansion process is decided based on the average of the tentative expansion coefficients for the plurality of pixels. More specifically, when any pixel is taken as the target pixel, the value of the expansion coefficient E to be used for the expansion process on data of the target pixel is decided based on the average of the "tentative expansion coefficients" for the plurality of pixels including the target pixel and the pixels therearound (i.e., based on the input video signals DIN of the plurality of pixels including the target pixel and the pixels therearound.) (it should be noted that the "tentative expansion coefficients" are obtained based on a function representing the inverse of saturation for a pixel with the saturation not smaller than a predetermined value, and obtained based on a quadratic function taking the saturation as a parameter for a pixel with the saturation not larger than the predetermined value.). This prevents a great change in expansion coefficient E between adjacent pixels. Accordingly, an image with smooth color variation is displayed. Thus, according to the present embodiment, there is achieved a liquid crystal display device capable of expanding a color space without causing an increase in IC size, an increase in cost, and display problems, and also capable of obtaining a display image with smooth color variation.

3. Third Embodiment

<3.1 Configuration, Etc.>

In each of the above first and second embodiments, the description has been given by taking the liquid crystal display device employing the color filter system as an example. However, the present invention is not limited thereto. So, an example where a liquid crystal display device employing a field-sequential color system is adopted will be described as a third embodiment of the present invention.

Figure 19:
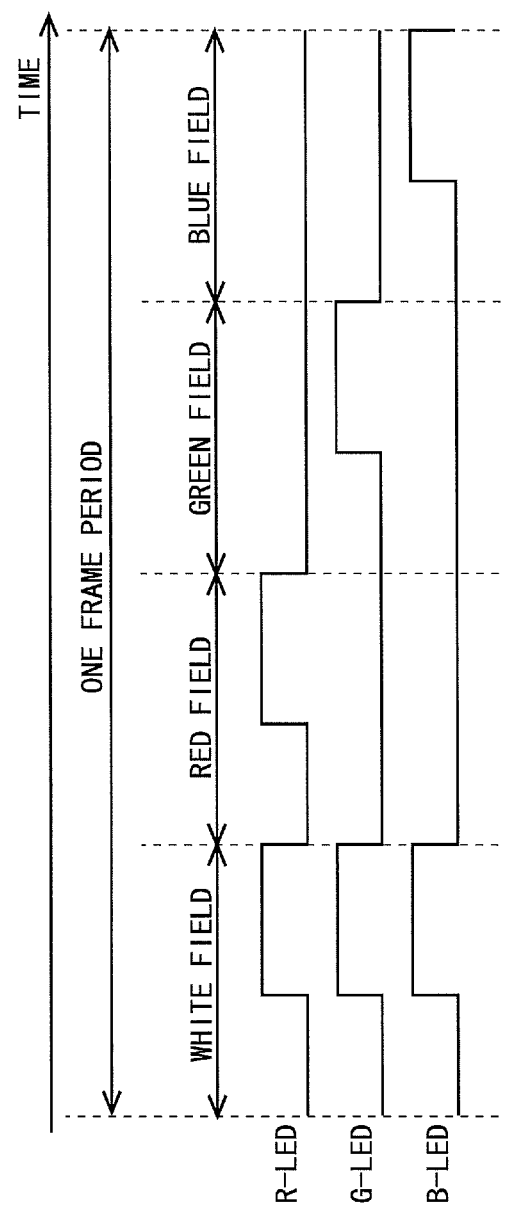
FIG. 19 is a diagram showing a configuration of one frame period in a liquid crystal display device according to a third embodiment of the present invention.

FIG. 19 is a diagram showing a configuration of one frame period in the present embodiment. As shown in FIG. 19, one frame period is temporally divided into a white field for displaying a white screen, a red field for displaying a red screen, a green field for displaying a green screen, and a blue field for displaying a blue screen. In the white field, the red LED, the green LED, and the blue LED come into a lighting state after the lapse of a predetermined period from a field starting point. In the red field, the red LED comes into the lighting state after the lapse of the predetermined period from the field starting point. In the green field, the green LED comes into the lighting state after the lapse of the predetermined period from the field starting point. In the blue field, the blue LED comes into the lighting state after the lapse of the predetermined period from the field starting point. During operation of the liquid crystal display device, the white field, the red field, the green field, and the blue field are repeated. Thereby, the white screen, the red screen, the green screen, and the blue screen are repeatedly displayed, and a desired color image is displayed on the display unit 410. Note that the order of the fields is not particularly limited. The order of the fields may be, for example, the order of "the white field, the blue field, the green field, and the red field." Further, the length of the period in which the LED is in the lighting state in each field may be set considering response characteristics of the liquid crystal. Moreover, the present invention is also applicable to a case where one frame period is configured by a combination other than the combination of "the white field, the blue field, the green field, and the red field."

The overall configuration is the same as that of the above first embodiment. However, differently from the above first embodiment, each pixel is not divided into a plurality of sub pixels. The signal processing circuit 100 is also the same as that of the above first embodiment. However, as a countermeasure against a slow response speed of the liquid crystal, the signal values of the output video signals (the white output video signal Wo, the red output video signal Ro, the green output video signal Go, and the blue output video signal Bo) may be corrected so that overdriving is performed. Note that the overdriving is a driving system in which the liquid crystal panel is supplied with a driving voltage higher than a previously decided gradation voltage corresponding to the signal value in the current field or a driving voltage lower than a previously decided gradation voltage corresponding to the signal value in the current field, in accordance with a combination of a signal value in one previous field and a signal value in the current field. That is, by the overdriving, a correction is made to emphasize a temporal change (not a spatial change) of the signal value.

With such a configuration, also in the present embodiment, the expansion coefficient E is obtained in the same manner as in the above first embodiment.

<3.2 Effect>

According to the present embodiment, the field-sequential color system is adopted for the driving system of the liquid crystal display device. By using the field-sequential color system, the color filters are not required, thereby making the light use efficiency high as compares with that of the liquid crystal display device employing the color filter system. This enables an increase in luminance and reduction in power consumption. From the above, there is achieved a liquid crystal display device capable of expanding a color space without causing an increase in IC size, an increase in cost, and display problems, and also capable of increasing luminance and reducing power consumption.

<3.3 Variant>

Also in a case in which the field-sequential color system is adopted for the driving system as in the above third embodiment, the expansion coefficient E may be obtained in the same manner as the above second embodiment. That is, in the liquid crystal display device employing the field-sequential color system, the average (or the median) of the "tentative expansion coefficients" for the plurality of pixels (the target pixel and the pixels therearound) may be decided as the expansion coefficient E for the target pixel. It should be noted that the "tentative expansion coefficients" are obtained based on a function representing the inverse of saturation for a pixel with the saturation not smaller than a predetermined value, and obtained based on a quadratic function taking the saturation as a parameter for a pixel with the saturation not larger than the predetermined value.

According to the present variant, it is possible to exert the effects which are obtained in the above first to third embodiments. That is, there is achieved a liquid crystal display device capable of expanding a color space without causing an increase in IC size, an increase in cost, and display problems, capable of obtaining a display image with smooth color variation, and capable of increasing luminance and reducing power consumption.

4. Others

The present invention is not limited to each of the above embodiments. A variety of modification may be made so long as not deviating from the scope of the present invention. For example, although the description has been made by using the example where one frame period is temporally divided into four fields in the above third embodiment, the present invention is also applicable to a liquid crystal display device adopting a field-sequential color system in which one frame period is divided into five or more fields. Further, the present invention is also applicable to a display device other than the liquid crystal display device.

The present application claims priority based on Japanese Patent Application No. 2015-186363 titled "DISPLAY DEVICE AND METHOD FOR EXPANDING COLOR SPACE" filed on Sep. 24, 2015, the content of which is incorporated herein by reference.

DESCRIPTION OF REFERENCE CHARACTERS

100: SIGNAL PROCESSING CIRCUIT
110: SIGNAL SEPARATION UNIT
120: EXPANSION COEFFICIENT DECISION UNIT
130: EXPANDED VIDEO SIGNAL GENERATION UNIT
140: OUTPUT VIDEO SIGNAL GENERATION UNIT
200: TIMING CONTROLLER
310: GATE DRIVER
320: SOURCE DRIVER
330: LED DRIVER
400: LIQUID CRYSTAL PANEL
410: DISPLAY UNIT
500: BACKLIGHT
E: EXPANSION COEFFICIENT
DIN: INPUT VIDEO SIGNAL
Ri, Gi, Bi: RED INPUT VIDEO SIGNAL, GREEN INPUT VIDEO SIGNAL, BLUE INPUT VIDEO SIGNAL
Re, Ge, Be: RED EXPANDED VIDEO SIGNAL, GREEN EXPANDED VIDEO SIGNAL, BLUE EXPANDED VIDEO SIGNAL
Wo, Ro, Go, Bo: WHITE OUTPUT VIDEO SIGNAL, RED OUTPUT VIDEO SIGNAL, GREEN OUTPUT VIDEO SIGNAL, BLUE OUTPUT VIDEO SIGNAL

The invention claimed is:

1. A display device provided with a display panel for displaying an image, the display device comprising:
   an expanded video signal generation unit configured to perform an expansion process for increasing a signal value of an input video signal, and output data obtained by the expansion process as an expanded video signal;
   an expansion coefficient decision unit configured to decide an expansion coefficient to be used for the expansion process by the expanded video signal generation unit; and
   an output video signal generation unit configured to generate an output video signal to be outputted to the display panel based on the expanded video signal, wherein
   the expansion coefficient decision unit
      decides the expansion coefficient based on a first function, which is a function representing an inverse of saturation obtained based on the input video signal, for a pixel with the saturation not smaller than a predetermined value, and
      decides the expansion coefficient based on a second function that is a quadratic function, in which saturation obtained based on the input video signal is set to a parameter and a coefficient of a quadratic term is a negative value, for a pixel with the saturation not larger than the predetermined value, and
   the expanded video signal generation unit multiplies the expansion coefficient, decided by the expansion coefficient decision unit, by a signal value of the input video signal for each pixel, to generate the expanded video signal.

2. The display device according to claim 1, wherein
   a value in the predetermined value of the first function is the same as a value in the predetermined value of the second function, and
   a slope of a curve representing the first function at the predetermined value is the same as a slope of a curve representing the second function at the predetermined value.

3. The display device according to claim 2, wherein
   a coefficient of a linear term in the second function is 0, and
   a value of a constant term in the second function is a maximum value of the expansion coefficient.

4. The display device according to claim 3, wherein
   one pixel includes a white sub pixel that displays white, a red sub pixel that displays red, a green sub pixel that displays green, and a blue sub pixel that displays blue, and
   the maximum value of the expansion coefficient is decided as a maximum value of a color value for the white sub pixel.

5. The display device according to claim 1, wherein when a pixel to be processed for obtaining the expansion coefficient is defined as a target pixel, the expansion coefficient decision unit decides an expansion coefficient to be used for the expansion process on an input video signal of the target pixel based on input video signals of a plurality of pixels including the target pixel and pixels around the target pixel.

6. The display device according to claim 5, wherein the expansion coefficient decision unit decides expansion coefficients obtained based on input video signals of the plurality of pixels, as tentative expansion coefficients, and decides an average of the tentative expansion coefficients, as an expansion coefficient to be used for the expansion process on an input video signal of the target pixel.

7. The display device according to claim 5, wherein the expansion coefficient decision unit decides expansion coefficients obtained based on input video signals of the plurality of pixels, as tentative expansion coefficients, and decides a median of the tentative expansion coefficients, as an expansion coefficient to be used for the expansion process on an input video signal of the target pixel.

8. The display device according to claim 1, wherein
   the input video signal includes a red input video signal, a green input video signal, and a blue input video signal,
   the display panel is configured to display an image based on the output video signal including a white output video signal, a red output video signal, a green output video signal, and a blue output video signal,
   the expanded video signal generation unit:
      generates a red expanded video signal based on the red input video signal;
      generates a green expanded video signal based on the green input video signal; and
      generates a blue expanded video signal based on the blue input video signal,
   the output video signal generation unit:
      generates the white output video signal based on the red expanded video signal, the green expanded video signal, and the blue expanded video signal;
      generates the red output video signal based on the white output video signal and the red expanded video signal;
      generates the green output video signal based on the white output video signal and the green expanded video signal; and
      generates the blue output video signal based on the white output video signal and the blue expanded video signal.

9. The display device according to claim 8, wherein
   one pixel includes a white sub pixel that displays white, a red sub pixel that displays red, a green sub pixel that displays green, and a blue sub pixel that displays blue,
   the white output video signal is provided to the white sub pixel,
   the red output video signal is provided to the red sub pixel,
   the green output video signal is provided to the green sub pixel, and
   the blue output video signal is provided to the blue sub pixel.

10. The display device according to claim 8, wherein
    the display panel is driven by a field-sequential color system in which one frame period is divided into a plurality of fields and a screen is rewritten in each of the fields to produce a color display,
    one frame period includes a white field for displaying a white screen, a red field for displaying a red screen, a green field for displaying a green screen, and a blue field for displaying a blue screen,
    the white output video signal is outputted to the display panel in the white field,
    the red output video signal is outputted to the display panel in the red field,
    the green output video signal is outputted to the display panel in the green field, and
    the blue output video signal is outputted to the display panel in the blue field.

11. A method for expanding a color space in a display device provided with a display panel for displaying an image, the method comprising:
    an expanded video signal generation step of performing an expansion process for increasing a signal value of an input video signal, and outputting data obtained by the expansion process as an expanded video signal;

an expansion coefficient decision step of deciding an expansion coefficient that is used for the expansion process in the expanded video signal generation step; and an output video signal generation step of generating an output video signal to be outputted to the display panel based on the expanded video signal, wherein in the expansion coefficient decision step, the expansion coefficient is decided based on a first function, which is a function representing an inverse of saturation obtained based on the input video signal, for a pixel with the saturation not smaller than a predetermined value, and the expansion coefficient is decided based on a second function that is a quadratic function, in which saturation obtained based on the input video signal is set to a parameter and a coefficient of a quadratic term is a negative value, for a pixel with the saturation not larger than the predetermined value, and in the expanded video signal generation step, the expansion coefficient, decided in the expansion coefficient decision step, is multiplied by a signal value of the input video signal for each pixel, to generate the expanded video signal.

* * * * *